US005923217A

United States Patent [19]

Durec

[11] Patent Number: 5,923,217

[45] Date of Patent: Jul. 13, 1999

[54] AMPLIFIER CIRCUIT AND METHOD FOR GENERATING A BIAS VOLTAGE

[75] Inventor: Jeffrey C. Durec, Chandler, Ariz.

[73] Assignee: Motorola, Inc., Schaumburg, Ill.

[21] Appl. No.: 08/883,981

[22] Filed: Jun. 27, 1997

[51] Int. Cl.[6] .......... H03F 3/68

[52] U.S. Cl. .......... 330/288; 330/296; 330/311

[58] Field of Search .......... 330/288, 296, 330/311

[56] References Cited

U.S. PATENT DOCUMENTS

| | | | |
|---|---|---|---|
| 4,263,562 | 4/1981 | Seiler | 330/288 X |
| 4,591,804 | 5/1986 | Van Tuijl | 330/311 X |
| 4,940,949 | 7/1990 | Landi | 330/262 |
| 5,049,834 | 9/1991 | Kasai | 330/255 |
| 5,254,957 | 10/1993 | Lauffenburger | 330/308 |
| 5,491,454 | 2/1996 | Matz | 330/149 |
| 5,521,553 | 5/1996 | Butler | 330/255 X |
| 5,535,444 | 7/1996 | Grandfield | 455/232.1 |
| 5,637,993 | 6/1997 | Whitney et al. | 330/288 X |

*Primary Examiner*—Steven J. Mottola
*Attorney, Agent, or Firm*—Rennie William Dover

[57] ABSTRACT

A low-noise amplifier circuit (40) and a method for generating a bias voltage within the amplifier circuit (40). The amplifier circuit includes a cascode configured circuit (15) having a common emitter transistor (12) biased by a current sourcing circuit (43) and a common base transistor (13) biased by a bias voltage generator (21). The current sourcing circuit (43) measures a base current of the common emitter transistor (12) and transmits the base current to a current mirror (41). Further, a current source (50) transmits a bias current to the current mirror (41). The current mirror sums the currents from the current sourcing circuit (43) and the current mirror (41) and generates a mirror output current. A portion of the mirror output current drives the bias voltage generator (21) and a portion of the mirror output current serves as the base current of the common base transistor (13).

21 Claims, 3 Drawing Sheets

-PRIOR ART-

-PRIOR ART-

AMPLIFIER CIRCUIT AND METHOD FOR GENERATING A BIAS VOLTAGE

BACKGROUND OF THE INVENTION

The present invention relates, in general, to semiconductor devices and, more particularly, to low noise amplifiers.

Generally, communications systems transfer information from a source to a destination using a combination of a transmitter and a receiver. Typically, the transmitter includes a transducer and a transmission element which together convert an electrical signal into an electromagnetic signal. The electromagnetic signal is then transmitted through a transmission medium to the receiver, which converts it into a desired form for a use by an end user. The transmission medium may be a copper cable, an optical fiber, air, etc.

The receiver portion of the communications system typically includes a low noise amplifier, a local oscillator, a mixer circuit, and an intermediate frequency (IF) amplifier coupled to an output of the receiver via a detector circuit. Most low-noise amplifiers are included in the receiver portion to optimize the noise figure of the receiver. These amplifiers usually have two or more gain stages as well as impedance matching networks. Preferably, the first stage is designed to have a low noise figure at a moderate gain and the second stage is designed to have a high gain at a moderate noise figure. A drawback of this type of design is that it limits the dynamic range or maximum receivable signal of the receiver.

Accordingly, it would be advantageous to have a method and a circuit for extending the dynamic range of a receiver system. It would be of further advantage for the method and circuit to be cost efficient and manufacturable using common semiconductor processing techniques.

DETAILED DESCRIPTION OF THE DRAWINGS

Generally, the present invention provides a low noise amplifier (LNA) and a method for extending the dynamic range of the low noise amplifier. The LNA of the present invention is capable of operating with a constant gain in a frequency range between at least approximately 10 megahertz (MHz) and approximately 10 gigahertz (GHz). Preferably, the LNA operates at a frequency of approximately 900 MHz. It should be understood that the operating frequency range of the LNA is not a limitation of the present invention.

Figure 1:
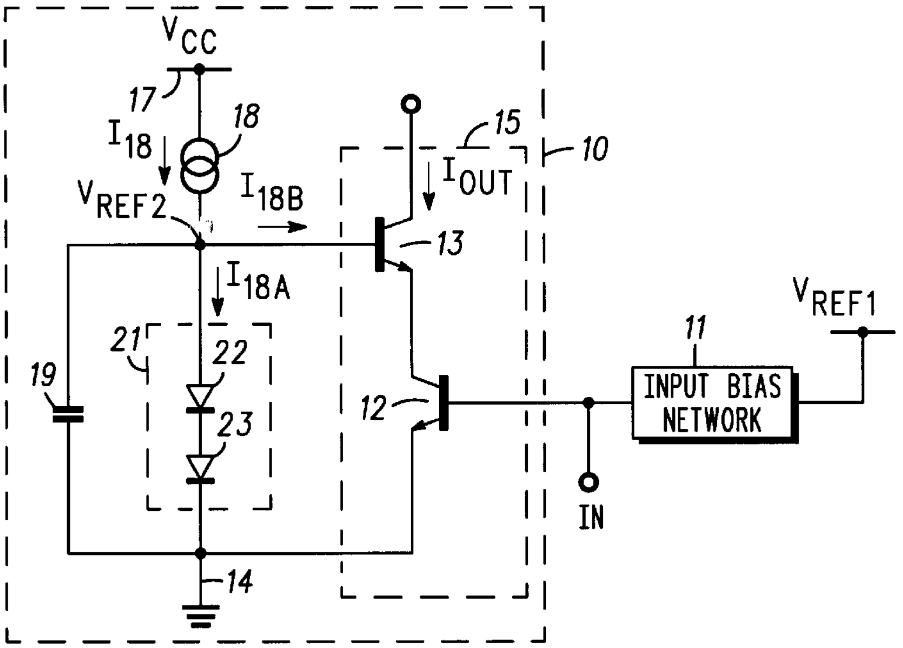
FIG. 1 is a schematic diagram of a prior art low noise amplifier.

FIG. 1 is a schematic diagram of a prior art low noise amplifier (LNA) 10 coupled to a reference voltage $V_{REF1}$ via an input bias network 11. LNA 10 includes a common emitter NPN bipolar transistor 12 connected to a common base NPN bipolar transistor 13 in a cascode configured circuit 15 or a cascode configuration. More particularly, an emitter terminal of transistor 12 is connected to a power supply terminal 14 which is coupled for receiving an operating potential such as, for example, ground. Although not shown, it should be noted that the emitter of transistor 12 may be coupled to power supply terminal 14 through a degeneration resistor, a degeneration inductor, or the like. The base terminal of transistor 12 serves as an input terminal, IN, of LNA 10 and is connected to a first terminal of input bias network 11. A second terminal of input bias network 11 is connected to reference voltage $V_{REF1}$. Input bias network 11 cooperates with reference voltage $V_{REF1}$ to maintain a constant voltage at input IN of LNA 10.

The collector terminal of transistor 12 is connected to the emitter terminal of transistor 13. The collector terminal of transistor 13 serves as an output terminal of LNA 10. The base terminal of transistor 13 is coupled to a power supply terminal 17 via a current source 18. The power supply terminal is coupled to a source of operating potential such as, for example, $V_{CC}$. A decoupling capacitor 19 is coupled between the base terminal of transistor 13 and power supply terminal 14. Further, the base terminal of transistor 13 is coupled to power supply terminal 14 via a bias network or voltage generator circuit 21. By way of example bias network 21 is comprised of two series connected diodes 22 and 23. The anode of diode 22 is connected to the base terminal of transistor 13, the cathode of diode 22 is connected to the anode of diode 23, and the cathode of diode 23 is connected to power supply terminal 14. It should be noted that the number of diodes present in bias network 21 is not a limitation of the present invention.

In operation, current source 18 provides a current $I_{18}$ which is used to bias transistor 13 and drive bias network 21. In particular, a portion, $I_{18A}$, of current $I_{18}$ drives diodes 22 and 23 and a portion, $I_{18B}$, serves as a base current for transistor 13. It should be noted that the sum of portions $I_{18A}$ and $I_{18B}$ is substantially equal to current $I_{18}$. In response to current $I_{18A}$, diodes 22 and 23 generate a reference voltage, $V_{REF2}$, at the base terminal of transistor 13. Reference voltage $V_{REF2}$ in conjunction with base current $I_{18B}$ and the cascode connection to transistor 12 biases transistor 13. Transistor 12 is biased via its common emitter connection, input bias network 11, reference voltage $V_{REF1}$, and the cascode connection to transistor 13. As those skilled in the art are aware, the collector current of the common emitter transistor of a cascode configured pair of transistors serves as the emitter current of the common base transistor of the cascode configured pair of transistors. The collector current of the common base transistor serves as output current $I_{OUT}$ of LNA 10.

Since transistor 12 is connected to transistor 13 in a cascode configuration, the emitter current of transistor 13 is equal to the collector current of transistor 12 and the base current, $I_{18B}$, of transistor 13 is substantially equal to the base current of transistor 12. A limitation of LNA 10 is that as the input power increases, i.e., when large alternating current (AC) signals appear at the input of LNA 10, the average base currents of transistors 12 and 13 also increase. The increase in base current $I_{18B}$ decreases the current flowing through bias network 21. When base current $I_{18B}$ becomes sufficiently high, reference voltage $V_{REF2}$ is no longer regulated and decreases or sags. In addition, the voltage at the emitter of transistor 13 decreases and eventually forces transistor 12 into saturation. Thus, the current in the collector of transistor 12 decreases and, in turn, the current in the collector of transistor 13 decreases, i.e., output current $I_{OUT}$ decreases. This tends to limit the amount of output power available from LNA 10 such that when the input power increases, the output power will stop increasing and begin to decrease. In other words, when the AC signal at the input is sufficiently high to cause the base current of transistor 13 to be approximately equal to current $I_{18}$, the output current, $I_{OUT}$, of LNA 10 essentially stops flowing.

Figure 2:
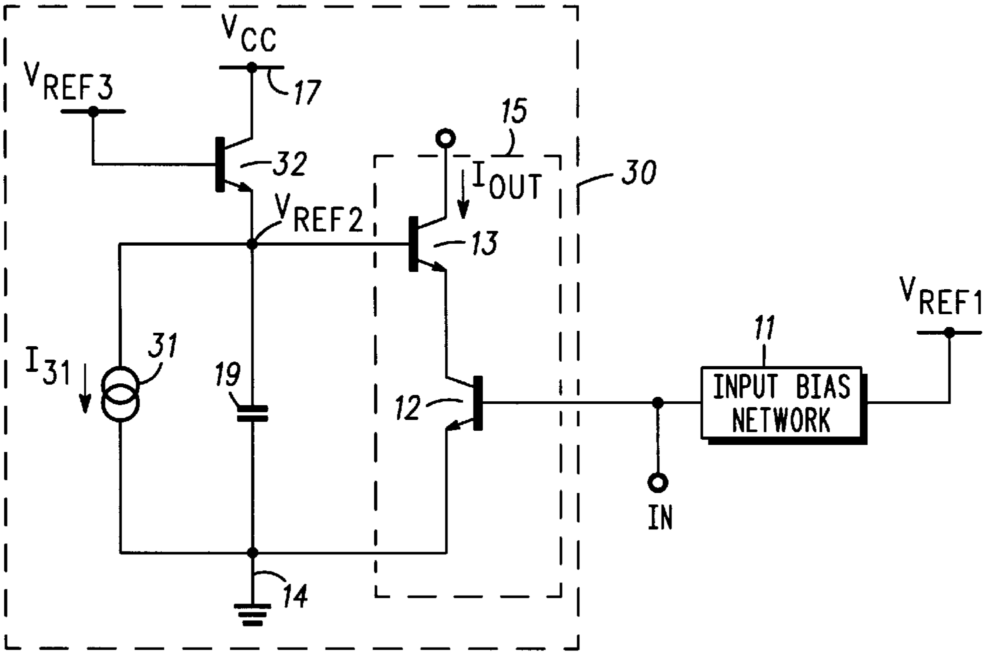
FIG. 2 is schematic diagram of another prior art low noise amplifier.

FIG. 2 is a schematic diagram of another prior art low noise amplifier 30 coupled to a reference voltage $V_{REF1}$ via an input bias network 11. LNA 30 includes a common emitter NPN bipolar transistor 12 connected to a common base NPN bipolar transistor 13 in a cascode configuration and decoupling capacitor 19 as described with reference to LNA 10 of FIG. 1. It should be understood that the same reference numerals are used in the figures to denote the same elements.

LNA 30 further includes a current source 31 having a first terminal coupled to the base terminal of transistor 13 and a second terminal coupled power supply terminal 14. Current source 31 generates a current $I_{31}$. Power supply terminal 14 is coupled to a source of operating potential such as, for example, ground. In addition, LNA 30 includes an NPN bipolar transistor 32 having an emitter terminal connected to the base terminal of transistor 13, a collector terminal connected to power supply terminal 17, and a base terminal coupled for receiving a reference voltage $V_{REF3}$. The collector terminal of transistor 13 serves as the output terminal of LNA 30 and conducts an output current $I_{OUT}$.

In operation, transistor 32 maintains the voltage level at the base terminal of transistor 13 such that it is substantially independent of the base current flowing into the base terminals of cascoded transistors 12 and 13. $V_{REF3}$ and current source 31 cooperate to ensure that transistor 32 operates in the forward active mode. A drawback of this circuit configuration is that the impedance looking into the emitter of transistor 32 is inductive at high frequencies. This inductance in combination with decoupling capacitor 19 causes the circuit to resonate at high frequencies thereby forming a high impedance point at the base terminal of transistor 13. Therefore, LNA 30 becomes unstable and oscillates at high frequencies. Thus, LNA 30 is unsuitable for high frequency applications.

Figure 3:
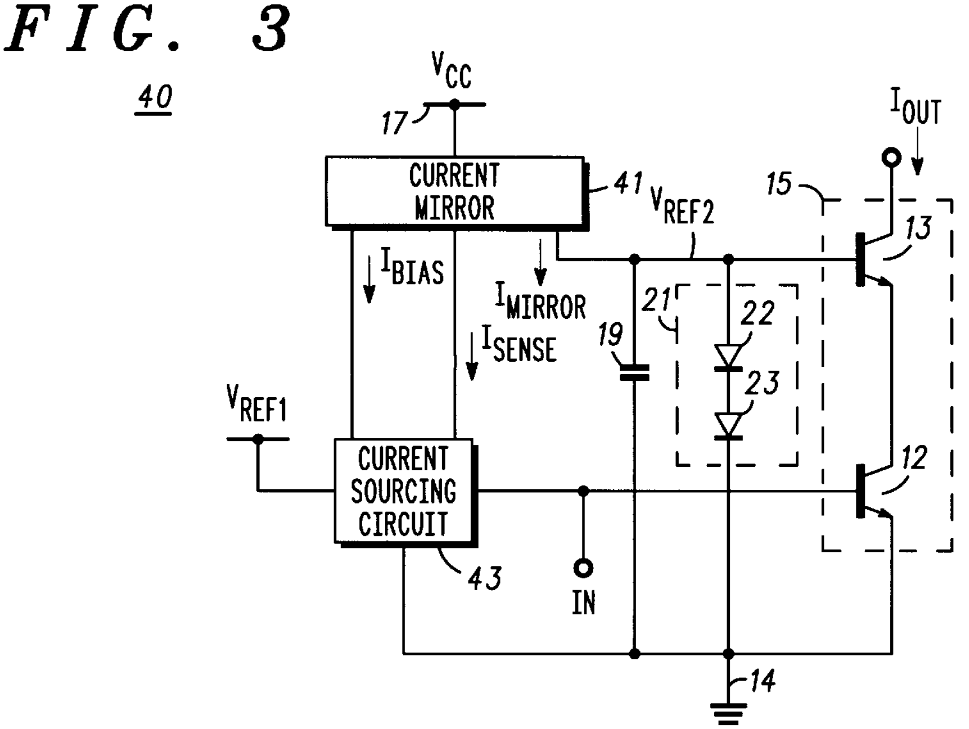
FIG. 3 is a schematic diagram of a low noise amplifier in accordance with the present invention.

FIG. 3 is a schematic diagram of a low noise amplifier (LNA) 40 in accordance with an embodiment of the present invention. LNA 40 includes cascode configured circuit 15, bias reference 21, and decoupling capacitor 19 as described with reference to LNA 10 of FIG. 1. It should be understood that the same reference numerals are used in the figures to denote the same elements.

LNA 40 further includes a current mirror circuit 41 having first and second input terminals and an output terminal. Current mirror circuit 41 is also referred to as a current mirror. A bias terminal of current mirror 41 is connected to power supply terminal 17, which in turn is coupled for receiving a bias signal $V_{CC}$. The first and second input terminals of current mirror 41 are coupled to first and second output terminals of a current sourcing circuit 43, respectively. Current sourcing circuit 43 is also referred to as a current control circuit. A current, IBIAS, is sourced from the first output terminal of current sourcing circuit 43 to the first input terminal of current mirror 41. Similarly, a current, $I_{SENSE}$, is sourced from the second output terminal of current sourcing circuit 43 to the second input terminal of current mirror 41. An output terminal of current mirror 41 is connected to the base terminal of transistor 13 and conducts a mirror current $I_{MIRROR}$.

In addition, a bias input terminal of current sensing circuit 43 is connected to reference voltage $V_{REF1}$ and a current sensing terminal is connected to the base terminal of transistor 12. Input terminal IN is also connected to the base terminal of transistor 12. An example of current sensing and current mirror circuits suitable for use with LNA 40 is described with reference to FIG. 4.

In operation, LNA 40 maintains its output signal at high frequencies by using a feed-forward technique, wherein the base current of transistor 12 is sensed and supplied in a feed-forward manner to the base of transistor 13. As discussed hereinbefore, the collector current of transistor 12 is cascoded through transistor 13 and, therefore, the emitter current of transistor 13 is equal to the collector current of transistor 12. In addition, the base current of transistor 13 is equal to the base current of transistor 12. The base current of transistor 12 is sensed or monitored by current sensing circuit 43. The bias current, IBIAS, and the sensed base current, $I_{SENSE}$, are then summed and mirrored through current mirror 41 to the output terminal of current mirror 41. The mirrored current is referred to as current $I_{MIRROR}$ or a mirrored summation current. Current $I_{MIRROR}$ supplies the base current for transistor 13 and the current for bias reference 21. The portion $I_{BIAS}$ ensures that bias reference 21 has sufficient current to provide the reference voltage $V_{REF2}$, and the sensed current $I_{SENSE}$ ensures that the base current of transistor 13 matches that of transistor 12. Thus, at high frequencies the base currents of transistors 12 and 13 remain equal and the reference voltage $V_{REF2}$ remains constant. Further, the circuit remains stable because a feed-forward circuit is used to generate the base current of transistor 13.

Figure 4:
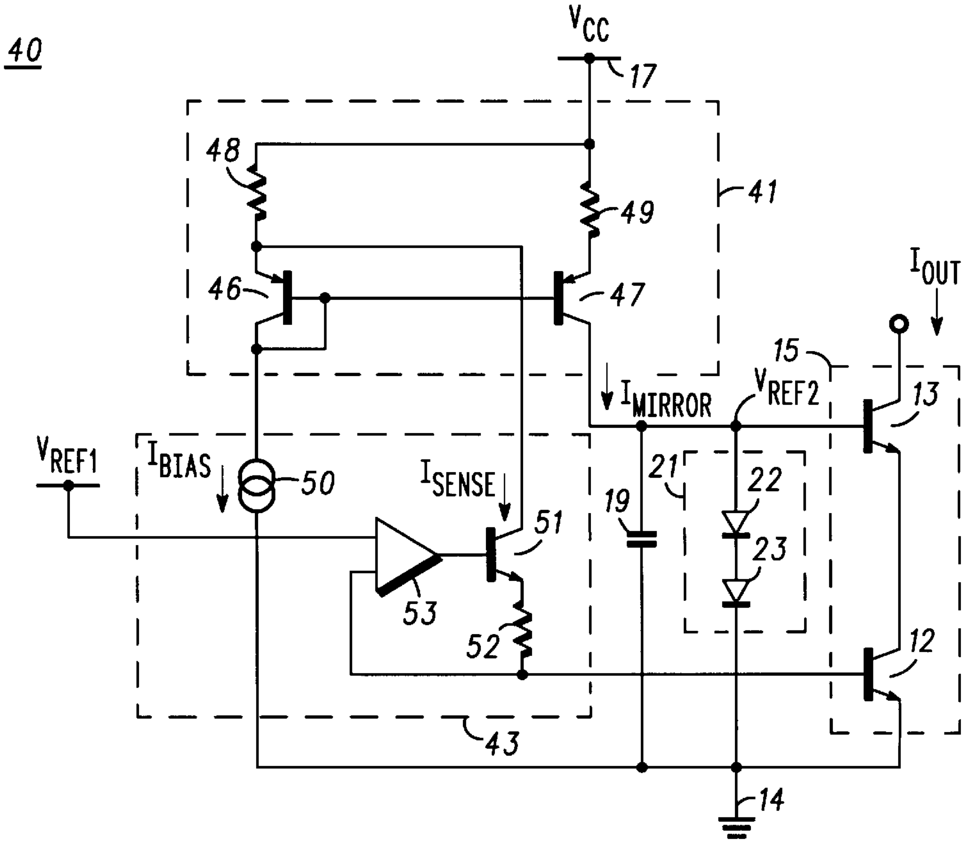
FIG. 4 is a schematic diagram of an embodiment for a current mirror circuit and a current sensing circuit suitable for use with the low noise amplifier of FIG. 3.

FIG. 4 is a schematic diagram of an embodiment for current mirror 41 and current sensing circuit 43 suitable for use with LNA 40. It should be understood that the same reference numerals are used in the figures to denote the same elements. Current mirror 41 is comprised of a pair of PNP bipolar transistors 46 and 47, wherein PNP bipolar transistor 46 is a diode connected transistor. More particularly, the base terminals of transistors 46 and 47 are commonly connected to each other and to the collector terminal of transistor 46 and to a first terminal of a current source 50. The emitter terminals of transistors 46 and 47 are coupled to power supply terminal 17 via degeneration resistors 48 and 49, respectively. The collector terminal of transistor 47 is connected to the base terminal of transistor 13. Transistor 47 is also referred to as a mirror transistor.

Current sensing circuit 43 is comprised of an NPN bipolar transistor 51 having a collector terminal connected to the emitter terminal of diode-connected transistor 46 and an emitter terminal coupled to the base terminal of transistor 12 via an impedance element 52 such as a resistor. Transistor 51 is also referred to as a current sourcing transistor. Current sensing circuit 43 is further comprised of a gain stage such as an amplifier 53 having a first input commonly connected to one terminal of resistor 52 and to the base terminal of transistor 12, and an output connected to the base terminal of transistor 51. A second input of amplifier 53 is connected to reference voltage $V_{REF1}$. In addition, current sensing circuit 43 includes current source 50, wherein one terminal of current source 50 provides bias current $I_{BIAS}$ and the other terminal of current source 50 is connected to power supply terminal 14. It should be noted that transistors 46 and 47 are not limited to being PNP transistors and transistor 51 is not limited to being an NPN transistor. In other words, transistors 46, 47, and 51 may be either NPN or PNP transistors.

Although current source 50 is illustrated and described as being an element of current sensing circuit 43, this is not intended to be a limitation of the present invention. For example, current source 50 may be absent from current sensing circuit 43. In the example in which a current source is absent from current sensing circuit 43, the collector of transistor 46 is coupled to power supply terminal 14 via a current source (not shown).

In operation, the voltage at the base of transistor 13 is established by current source 50 in cooperation with current mirror circuit 41 when the input power is low, i.e., less than approximately −50 decibels when referenced to one milliwatt (dBm). As those skilled in the art are aware, the output current of a current mirror circuit is substantially equal to its input current. Thus, the output current of current mirror 41 is substantially equal to the collector current of diode-connected transistor 46, which in turn is substantially equal to the current of current source 50. Thus, the output current $I_{MIRROR}$ of current mirror 41 is substantially equal to current $I_{BIAS}$. Mirror output current $I_{MIRROR}$ flows through diodes 22 and 23 of bias reference 21 and generates voltage reference $V_{REF2}$. At low input power levels, the base current of transistor 13 is negligible compared to mirror current $I_{MIRROR}$; therefore, most of current $I_{MIRROR}$ flows through diodes 22 and 23.

At higher input power levels, e.g., input power levels greater than approximately −50 dBm, the base current of transistor 12 increases. When the base current of transistor 12 becomes comparable to current $I_{BIAS}$, the feedback loop formed by amplifier 53, transistor 51, and resistor 52 causes transistor 51 to conduct additional collector current, thereby maintaining a direct current (DC) bias voltage at the base terminal of transistor 12 that remains essentially constant at all input power levels. However, as the input power increases at the base terminal of transistor 12, the average base current of transistor 12 increases. The increased base current is approximately equal to the collector current, $I_{SENSE}$, of transistor 51. The sum of current $I_{BIAS}$ and collector current $I_{SENSE}$ is mirrored to the collector of transistor 47. In other words, current mirror current $I_{MIRROR}$ is substantially equal to the sum of currents $I_{BIAS}$ and $I_{SENSE}$.

Because of the cascode configuration of transistors 12 and 13, the base current of transistor 13 is substantially equal to the base current of transistor 12. As described hereinbefore, the base current of transistor 12 is equal to the collector current of transistor 51, i.e., $I_{SENSE}$, which is mirrored to the output terminal of current mirror 41. Thus, one portion of mirrored current $I_{MIRROR}$ provides a base current for transistor 13 that is substantially equal to the base current of transistor 12 and another portion of mirrored current $I_{MIRROR}$ provides a drive current for diodes 22 and 23 that is substantially equal to current $I_{BIAS}$. The portion of current $I_{MIRROR}$ that provides the base current of transistor 13 is also referred to as an equilibrium current. Accordingly, a sufficient current is always available for driving diodes 22 and 23 and creating a constant reference voltage $V_{REF2}$. Likewise, a base current that is substantially equal to the base current of transistor 12 is always available for transistor 13. Because output current $I_{OUT}$ is the collector current of transistor 13, it is proportional to the base current of transistor 13.

Figure 5:
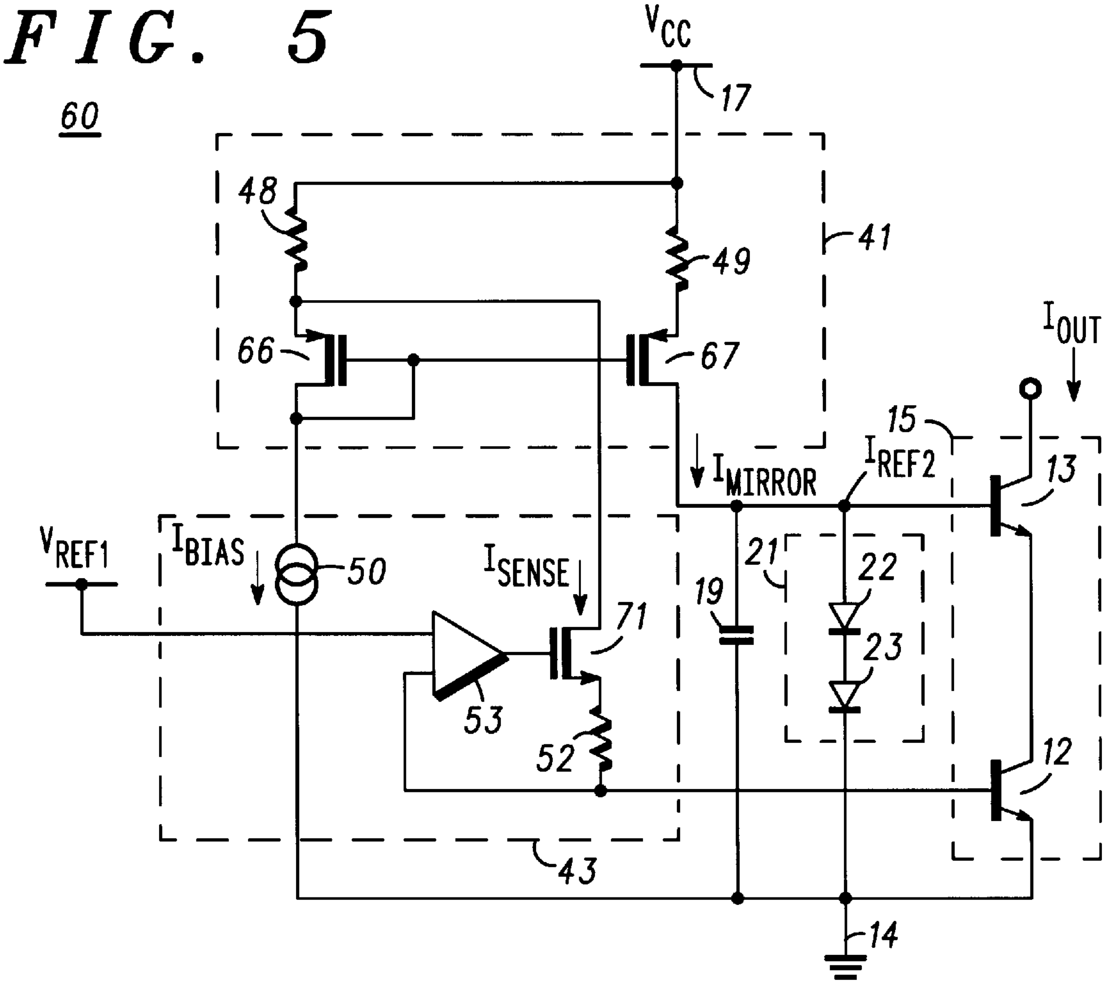
FIG. 5 is a schematic diagram of another embodiment for a current mirror circuit and a current sensing circuit suitable for use with the low noise amplifier of FIG. 3.

FIG. 5 is a schematic diagram of another embodiment for current mirror 41 and current sensing circuit 43 suitable for use in LNA 60. It should be understood that the same reference numerals are used in the figures to denote the same elements. Current mirror 41 is comprised of a pair of p-channel field effect transistors (FETs) 66 and 67, wherein p-channel FET 66 is a diode connected transistor. More particularly, the gate terminals of transistors 66 and 67 are commonly connected to each other, to the drain terminal of transistor 66, and to a first terminal of current source 50. The source terminals of transistors 66 and 67 are coupled to power supply terminal 17 via degeneration resistors 48 and 49, respectively. The drain terminal of transistor 67 is connected to the base terminal of transistor 13.

Current sensing circuit 43 is comprised of an n-channel FET 71 having a drain terminal connected to the source terminal of diode-connected transistor 66 and a source terminal coupled to the base terminal of transistor 12 via a resistor 52. Current sensing circuit 43 is further comprised of an amplifier 53 having a first input commonly connected to one terminal of resistor 52 and to the base terminal of transistor 12, and an output connected to the gate terminal of transistor 71. A second input of amplifier 53 is connected to reference voltage $V_{REF1}$. In addition, current sensing circuit 43 includes current source 50, wherein one terminal of current source 50 provides bias current $I_{BIAS}$ and the other terminal of current source 50 is connected to power supply terminal 14. It should be noted that the difference between the embodiment shown in FIG. 4 and that of FIG. 5 is that bipolar transistors 46, 47, and 51 have been replaced by field effect transistors 66, 67, and 71, respectively. Accordingly, the operation of LNA 60 is analogous to that of LNA 40. It should be noted that transistors 66 and 67 are not limited to being p-channel FETs and transistor 71 is not limited to being an n-channel FET. In other words, transistors 66, 67, and 71 may be either p-channel or n-channel FETs. As those skilled in the art are aware, when the polarities of transistors 66, 67, and 71 are switched, then the polarities of transistors 12 and 13 and the polarities of diodes 22 and 23 should also be switched. Further, the power supply connections are also inverted such that terminals connected to $V_{CC}$ are switched and connected to ground and terminals that are connected to ground are switched and connected to $V_{CC}$. Further, the base terminal of a bipolar transistor and the gate terminal of a field effect transistor are also referred to as control electrodes. Likewise, the collector and emitter terminals of a bipolar transistor and the drain and source terminals of a field effect transistor are also referred to as current conducting electrodes.

By now it should be appreciated that a low noise amplifier and a method for maintaining the output power of the low noise amplifier have been provided. The low noise amplifier prevents the common emitter transistor of a cascode configured pair of transistors from entering saturation, ensuring that the low noise amplifier remains operational as the input power is increased. The LNA of the present invention is capable of maintaining the gain to at least −10 dBm of input power with a base current of greater than 100 micro-amperes ($\mu$A), i.e., the gain remains substantially constant when the input power is less than or equal to −10 dBm.

I claim:

1. An amplifier circuit, comprising:

a cascode configured circuit having a first input, a second input, a first current conducting electrode, and a second current conducting electrode;

a bias voltage generator having a terminal coupled to the second input of the cascode configured circuit;

a current sourcing circuit having an input, a first output, and a second output, wherein the first output is coupled to the first input of the cascode configured circuit;

a current mirror having a first input, a second input, and an output, wherein the first input of the current mirror is coupled to the second output of the current sourcing circuit and the output of the current mirror is coupled to the second input of the cascode configured circuit; and a current source having an input coupled to the first input of the current mirror.

2. The amplifier circuit of claim 1, wherein the cascode configured circuit includes:

a first transistor having a control electrode, a first current conducting electrode, and a second current conducting electrode, wherein the control electrode is coupled to the first input of the cascode configured circuit; and a second transistor having a control electrode, a first current conducting electrode and a second current conducting electrode, wherein the first current conducting electrode of the first transistor is coupled to the second current conducting electrode of the second transistor and the control electrode of the second transistor is coupled to the second input of the cascode configured circuit.

3. The amplifier circuit of claim 2, wherein the first and second transistors are NPN bipolar transistors.

4. The amplifier of claim 1, further including a capacitor coupled to the second input of the cascode configured circuit.

5. The amplifier of claim 1, wherein the current sourcing circuit comprises:

a current sourcing transistor having a control electrode, a first current conducting electrode, and a second current conducting electrode;

an impedance element coupled between the second current conducting electrode of the current sourcing transistor and the first input of the cascode configured circuit; and a gain stage having first and second inputs and an output, wherein the first input of the gain stage is coupled to the first input of the cascode configured circuit and the output is coupled to the control electrode of the current sourcing transistor.

6. The amplifier circuit of claim 5, wherein the current sourcing transistor is an NPN bipolar transistor and the impedance element is a resistor.

7. The amplifier circuit of claim 1, wherein the current mirror comprises:

a diode-connected transistor having a control electrode, a first current conducting electrode, and a second current conducting electrode, wherein the control electrode is coupled to the first current conducting electrode; and a mirror transistor having a control electrode, a first current conducting electrode, and a second current conducting electrode, wherein the control electrode is coupled to the control electrode of the diode-connected transistor, the first current conducting electrode is coupled to the second input of the cascode configured circuit, and the second current conducting electrode is coupled to the second current conducting electrode of the diode-connected transistor.

8. The amplifier circuit of claim 7, wherein the current mirror further includes:

a first resistor having a terminal coupled to the second current conducting electrode of the diode-connected transistor; and a second resistor having a terminal coupled to the second current conducting electrode of the mirror transistor.

9. The amplifier circuit of claim 7, wherein the diode-connected transistor and the mirror transistor are PNP bipolar transistors.

10. The amplifier circuit of claim 7, wherein the diode-connected transistor and the mirror transistor are p-channel field effect transistors.

11. The amplifier circuit of claim 1, wherein the bias voltage generator comprises two or more series coupled diodes, wherein an anode of a first diode is coupled to the second input of the cascode configured circuit and a cathode of the first diode is coupled to the anode of a second diode.

12. A low-noise amplifier (LNA), comprising:

a first transistor having a control electrode, a first current conducting electrode, and a second current conducting electrode, wherein the control electrode is coupled for receiving a first reference voltage;

a second transistor having a control electrode, a first current conducting electrode, and a second current conducting electrode, wherein the second current conducting electrode of the second transistor is coupled to the first current conducting electrode of the first transistor;

a voltage generator circuit having first and second terminals, wherein the first terminal is coupled to the control electrode of the second transistor;

a current mirror having an input terminal and an output terminal, wherein the output terminal is coupled to the control electrode of the second transistor; and a current sourcing circuit having an input, a first output, and a second output, wherein the first output is coupled to the control electrode of the second transistor and the second output is coupled to the input terminal of the current mirror.

13. The low-noise amplifier of claim 12, wherein the voltage generator circuit comprises:

a first diode having an anode and a cathode, wherein the anode is coupled to the control electrode of the second transistor; and a second diode having an anode and a cathode, wherein the anode of the second diode is coupled to the cathode of the first diode and the cathode of the second diode is coupled to a first power supply terminal.

14. The low-noise amplifier of claim 12, further including a current control circuit having first and second terminals, wherein the first terminal is coupled to the current mirror and the second terminal is coupled to the control electrode of the first transistor.

15. The low-noise amplifier of claim 14, wherein the current control circuit includes:

a third transistor having a control electrode, a first current conducting electrode, and a second current conducting electrode;

a resistor coupled between the second current conducting electrode of the third transistor and the control electrode of the first transistor; and a gain stage having first and second inputs and an output, wherein the first input is coupled to the control electrode of the first transistor and the output is coupled to the control electrode of the third transistor.

16. The low-noise amplifier of claim 12, wherein the current mirror includes:

a diode-connected PNP bipolar transistor having a base terminal, an emitter terminal, and a collector terminal, wherein the base terminal is connected to the collector terminal and the collector terminal is coupled to the input terminal of the current mirror; and a PNP bipolar transistor having a base terminal, an emitter terminal, and a collector terminal, wherein the emitter terminal of the PNP bipolar transistor is coupled to the emitter terminal of the diode-connected PNP bipolar transistor, the base terminal of the PNP bipolar transistor is coupled to the base terminal of the diode-connected PNP bipolar transistor, and the collector terminal of the PNP bipolar transistor is coupled to the control electrode of the second transistor.

17. A method for generating a bias voltage, comprising the steps of:

generating a first current;

sensing a bias current of a common emitter transistor to generate a sensed bias current;

feeding forward the sensed bias current to the base of a common base transistor by:

using the sensed bias current to generate a sense current;

summing the first current with the sense current to form a summation current;

mirroring the summation current to form a mirrored summation current; and using a portion of the mirrored summation current to generate a bias voltage.

18. The method of claim 17, further including the step of using another portion of the mirrored summation current to generate an equilibrium current, wherein the equilibrium current matches the sense current.

19. The method of claim 18, further including the step of generating an output current that is proportional to the equilibrium current.

20. The method of claim 17, further including the step of using the sense current to generate a reference voltage.

21. The low-noise amplifier of claim 12, further including a current source having first and second terminals, wherein the first terminal is coupled to the input terminal of the current mirror.

* * * * *